United States Patent
Harberts et al.

[11] Patent Number: 6,014,066
[45] Date of Patent: Jan. 11, 2000

[54] TENTED DIODE SHUNT RF SWITCH

[75] Inventors: Harry S. Harberts, San Marcos; Jeffrey A. Grant, Encinitas, both of Calif.

[73] Assignee: TRW Inc., Redondo Beach, Calif.

[21] Appl. No.: 09/135,206

[22] Filed: Aug. 17, 1998

[51] Int. Cl.[7] ................................................. H01P 1/15
[52] U.S. Cl. .................. 333/104; 257/735; 333/246; 333/247; 336/197; 361/782
[58] Field of Search .................... 333/103, 104, 333/246, 247, 262; 361/782, 806, 811; 257/532, 624, 625, 664, 725, 735; 336/197; 338/216

[56] References Cited

U.S. PATENT DOCUMENTS

| | | | |
|---|---|---|---|
| 2,810,891 | 10/1957 | Engelmann | 333/246 X |
| 3,982,212 | 9/1976 | Wallington et al. | 333/262 X |
| 4,114,120 | 9/1978 | Lupfer | 333/246 |
| 4,768,004 | 8/1988 | Wilson | 333/216 |

OTHER PUBLICATIONS

Sahjani & White, "Pin Diode Operation . . . ", Applied Microwave, Spring 1991, pp. 68–78 U.S.
Hewlett Packard Co, Application Note 957–1 Feb. 1990, 2 pages, U.S.
Hiller, "Design with Pin Diodes" Bulletin AG312 MA–COM Semiconductor Prod. Div, 1986 18 pages U.S.
"How to Specify Pin Diodes Switches", American Microwave Corp App. Note 1–0690, Jun. 1990, pp. 26–31 U.S.
"Simplifying the Specs of Pin Diode Switches," Algeri & Hicks, Microwaves & RF, Jul. 1986, pp. 83–91 U.S.

*Primary Examiner*—Paul Gensler
*Attorney, Agent, or Firm*—Michael S. Yatsko; Ronald M. Goldman

[57] ABSTRACT

A stand-alone circuit board (3), a packaged surface mount PIN diode (1) and a metal ribbon (9) are mounted together in a new tented diode configuration. The flat end surface of the diode end terminal (4) is attached to a metal trace (5) on the circuit board, positioning the diode in an upstanding position, overlying the metal trace and leaving the other diode end terminal (2) in an elevated position over the circuit board. The metal ribbon wraps over the diode symmetrically extending along opposed sides of the diode to complete an electrical connect on the circuit board. In performance, the configuration emulates that prior configuration employing a thick metal plate backed circuit board. An improved RF switch incorporates the foregoing tented diode configuration.

30 Claims, 4 Drawing Sheets

TENTED DIODE SHUNT RF SWITCH

FIELD OF THE INVENTION

This invention relates to RF switches and its component switching impedance element and, more particularly, to a mounting configuration for mounting the surface mount impedance element to a stand-alone type printed circuit board and to an RF switch incorporating same. The new mounting configuration emulates the favorable RF characteristics of the prior mounting configuration in which a PIN diode is mounted to a thick metal plate backed type printed circuit board.

BACKGROUND

An RF switch is an electronic "on-off" switch for high frequency RF signals. The switch permits an RF signal applied to an input port to normally propagate to a switch output port, when "on", and, alternately, block passage of such high frequency RF signals, when turned "off". The switch is turned on or off depending upon the polarity of a DC control voltage applied to the switch's control input. As is known such kinds of switches are typically used in transmit/receive and interrogation systems.

RF switches come in a variety of configurations. The basic one is a single pole single throw (SPST), containing a single RF input and RF output. Others come in single pole multiple throw (SPMT) configurations. A typical RF switch contains two ports or outputs, which are separately controlled, that are fed from a single input port, and is referred to as a single pole double throw (SPDT) configuration. In that switch, one of the output ports may be "on" while itched "off", and vice-versa. Typically the RF switch accomplishes such electronic switching with RF switching diodes, also known as PIN diodes, a principal component element of the RF switch's electronic circuitry.

The term RF switching diode or switching diode as used in this specification refers to a PIN diode, which is believed to be the only diode used at present to switch RF signals as described. However, it is understood that the term is a functional one and has a more generic meaning and intent. The term is intended to encompass any other diode or diode equivalent device as well that in the future may be discovered which, though accomplishing the same and/or additional functions and characteristics to that accomplished with the PIN diode, becomes known by a name different than PIN. It also can encompass the surface mounted impedance elements, such as capacitors.

As is known to those skilled in the art, the PIN diode is a two terminal semiconductor device. As in any diode, it conducts current in only one direction, from the positive polarity terminal or anode to the negative polarity terminal or cathode, as variously termed. With a positive voltage on its anode, the diode is forward biased and will conduct current. If biased to conduct current, that is, if forward biased, the diode offers very little or essentially no resistance to current flow. It is in its "on" state. If oppositely biased, that is, is back biased, the diode offers an infinitely high resistance and forms an essentially open circuit through which electrical current cannot normally pass. It is in its "off" state.

The diode requires a finite time to change from the one state to the other with a change in voltage. That characteristic is referred to as the diode's "transition time". In order to change the diode's conducting state from one state to the other, the new voltage biasing the diode to the opposite conductive state must be applied to the diode for the diode's minimum transition time.

Any alternating current (AC) signal, such as an RF voltage, that is superimposed upon the back biasing DC control voltage does not change the PIN diode's non-conducting state, so long as the frequency of that signal is sufficiently high, such that the duration of the voltage swings or peaks in the signal is insufficient to satisfy the minimum required time to transition the diode from an "off" state to an "on" state. However, by changing the polarity of the DC,control voltage so as to forward bias the diode, the diode changes its conducting state and conducts current, including the AC signal. When thus forward biased, as was true in the back biased condition, any alternating current signal, AC, of a sufficiently high frequency that is superimposed upon the forward biasing DC control voltage does not change the diode's conducting state.

There is a limit to such superimposed signals. If the AC is high enough in voltage it could exceed the diode's breakdown voltage and destroy the diode. However, to avoid that, the PIN diode is selected such that the anticipated maximum level of the superimposed AC signal should never exceed the selected diode's breakdown voltage.

Thus a unique characteristic of the PIN diode is that, when forward biased, it conducts the RF signal even though the peak voltage levels of that RF signal exceed the level of that forward bias. By design the RF frequencies employed in the electronic systems using the diode as an RF switch are sufficiently high in frequency so as not to alter the conductive state in which the diode is placed by the DC control voltage biasing the diode. Additional technical information on the PIN diode and its application in RF switches, if of interest, may be found in the following publications: "Pin Diode Operation and Design Trade-Offs, Sahjani & White, Applied Microwave, Spring 1991, pp 68–78; "Broadbanding the Shunt PIN Diode SPDT Switch, Application Note 957-1, Hewlett Packard Co. Febrero. 1990 (2 pages); "Design with PIN Diodes", Hiller, bulletin, AG312, MA-COM Semiconductor Products Div. 1986 (18 pages); "How to Specify PIN Diode Switches", (pp 26–31) American Microwave Corp., Application Note 1-0690, June 1990, and "Simplifying the specs of PIN-diode switches", Algeri & Hicks, Microwaves & RF, July 1986 (pp 83–91).

In its construction, a shunt RF switch takes advantage of the PIN diode's electrical characteristics. Speaking generally, with a PIN diode placed in shunt of an RF transmission line and back biased by the control voltage, the diode appears as an open circuit; permitting applied RF to propagate along the transmission line to the output. When, however, the diode is forward biased and thereby conducts current, it offers a very low impedance path to the RF, and shunts the RF from the transmission line through the diode to electrical ground potential, bypassing the transmission line output or, as variously termed, output port. The RF, therefore, cannot pass further along the transmission line. The RF switch's output port, being bypassed, is effectively isolated from the switch's input.

With RF present or not at the output port in dependence on the control voltage applied to the PIN diode, the foregoing shunting device effectively forms a single pole single throw (SPST) RF switch. As is known, a practical shunt RF switch typically includes additional components to provide DC isolation between the switch's input and output ports and one or more shunt switching diodes to implement the foregoing shunting action.

The RF switch is packaged in a single mechanical assembly that holds the components in a predefined physical relationship or in a larger package in common with other electronic devices that serve together as components of a more extensive electronic circuit. That is, the switch circuit is installed on a printed circuit board or the like, wherein the components are electrically inter-connected in the appropriate electrical circuit via electrical conductors, microstrip traces, formed on the circuit board; the components and supporting circuit board mechanically define a unitary assembly, the package.

PIN diodes and other diodes are commercially available, unpackaged, as a die, which must be wire bonded by the purchaser to connect to other circuit elements, and are available in a variety of surface mount cases or, as alternately termed, surface mount packages. One such diode package is mechanically configured in a generally rectangular or square shape overall for convenient mounting to the surface of the circuit board. The diode's anode and cathode terminals are metal pieces that are somewhat rectangular in shape, are of a small thickness, and have a flat outer surface. They are slightly larger in length and width dimension that the insulated portion of the body. Those terminals are arranged at the front and rear ends of the diode and are suitable for soldering to a metal trace on a printed circuit board. PIN Diodes of such configuration are also referred to variously as surface mount diodes or packaged surface mount PIN diodes or packaged PIN diodes, and the terms should be regarded as synonymous. It thus should be understood that when reference is made in this specification to any of a packaged PIN diode or packaged surface mount PIN diode or simply to a PIN diode, the reference is to the afore described packaged surface mount structure.

The terminal's flat end surface permits the electrical current that passes through the diode to be distributed over the widest possible area when the terminal is soldered to a metal trace of like dimension. When, however, the diode is placed on its side, the electrical current must pass through the smaller area available through the side edge of the terminal, resulting in a higher current density than with the former connection.

Generaly, parasitic elements introduced by component mounting hinders the ability of achieving high performance levels from a surface mount diode in high frequency RF applications. And it is necessary to minimize any additional parasitics, such as inductance and resistance, introduced by mounting the component to the circuit.

At low RF frequencies, little concern is given to the electronic characteristics of the electrical lead and its connection to the solder pad, other than ensuring a firm solder connection. A connection to the solder pad possesses an inherent inductance, resistance and capacitance, but the resultant parasitic impedance at low frequencies is quite low and does not significantly affect the operation of low frequency circuits. At very high RF frequencies, such as those contemplated by the present invention, the pad's electronic characteristics become very significant, particularly in connection with the operation of switching diodes, the subject of the present application. The inductance, resistance and capacitance of the solder pad at the high frequencies can produce a significant impedance.

In the described shunt RF switch, the output or port is "turned off" by activating the diode, which places a very low impedance path from the microstrip trace to electrical ground that bypasses and effectively isolates the output port from the input. On/off port isolation is reduced, however, if any parasitics increase that impedance. When impedance in series with the diode is increased, the diode no longer completely shunts the output port. Some portion of the signal then appears as a voltage drop across the impedance and also appears at the output port. Thus the ratio of the output port RF level, when the port is "off", to the corresponding input RF level, the measure of port isolation, increases.

In RF applications a widely used and produced printed circuit board is referred to herein as a "stand-alone" circuit board. It typically contains plated-on metal traces defining a circuit pattern, means for mounting electrical components for connection within the circuit pattern and a plated-on thin metal layer on the underside to serve as the electrical ground. On this packaging, the surface mount switching diode is mounted lying down, that is, lying on its side against the upper surface of the board, with the narrow side edge of one of its end terminals soldered in place to a microstrip metal trace and another narrow side edge of the opposite end terminal soldered to a nearby ground pad.

In that prior stand alone circuit board diode mounting configuration, the electric current conducted through the diode is concentrated near the terminal's side edges. The only path for the current from the diode is through the side edge of the end terminal to the solder pad on the metal trace. The current through the upper edge of that end terminal is consequently lower than it should be due to the resultant pad parasitics. Because the area of this side edge is much less than that of the end of the terminal, it presents a smaller path for current flow than does the entire terminal end. A smaller path effectively creates greater resistance to current flow; and the resultant effect is an increase in parasitic elements, the resistance, capacitance and inductance. The small area at the side edge routes all diode current. As a consequence, the current density is the greatest at this point, and that prevents optimal current flow. Thus, the foregoing stand-alone circuit board and "lying down" diode mounting configuration could not provide reasonable isolation for high frequency shunt RF switches.

To minimize those parasitics in the RF switch, packaged PIN diodes have heretofore been mounted to thick metal plate mounted printed circuit boards using a "tented diode" configuration. In this printed circuit board, a thick metal backing plate underlies and supports the printed circuit board; and the metal plate serves as an electrical ground. The circuit board contains a cut-out opening through the circuit board's insulating material, exposing a portion of the underlying thick metal plate. The surface mount PIN diode, being a short rectanguloid figure in shape, containing square shaped metal ends that serve as the diodes electrical terminals, is mounted on end, upstanding, to the thick metal plate, perpendicular to the circuit board. One of the diode's end terminals extends through that cut-out opening to full end contact with the underlying thick metal backing plate and is soldered in place thereto, leaving the diode's remaining end terminal elevated above the surface of the printed circuit board.

To complete the diode's mounting, a metal ribbon, which serves as an electrical lead to the diode, is placed across the cut-out region, over and in electrical contact with the diode's upstanding end terminal; and the ends of that metal ribbon are connected to appropriate metal traces on the circuit board on opposite sides of the diode. Those metal traces provide the connection to other circuit elements on the circuit board. In appearance the foregoing ribbon resembles a familiar pup tent and, hence, the diode is said to be "tented". The present invention also involves tenting the switching diode.

Ribbon tenting of the packaged diode effectively provides a secondary path for the pad current and a larger conducting area, which lowers parasitic induced impedance and allows near uniform pad current flow. Electrical current through the diode is uniformly distributed through the face of the electrical terminal and adjacent solder pad on the circuit board. The increase in conducting area produces a decrease in diode pad parasitics. That phenomenon occurs on both sides of the diode since the opposite pad makes full contact with the microstrip trace. In one practical embodiment, tests reveal a 13.7 dB increase in isolation going from a side mounted architecture to the tented configuration.

Despite the disadvantage of increased weight and expense of the thick metal backing plate and a cut-out on the printed circuit board such mounting configuration offered the only viable choice for shunt RF switches with discrete packaged parts. As a consequence the circuit designer is given a single choice of packaging, but that choice was one that satisfied all of the designer's needs. Despite long-standing engineering practice of minimizing or reducing weight in airborne and spacecraft electronics systems and seemingly natural goals of lowering manufacturing costs of electronic equipments, as would naturally accrue from use of a stand-alone circuit board in shunt RF switch applications, until the present invention, a stand-alone packaging system remained impractical for shunt RF switch applications.

The present invention resurrects the stand-alone printed circuit board as part of the mounting structure for a packaged PIN diode in a shunt RF switch, yet permits optimal current flow and results in lower parasitics than the prior shunned stand-alone circuit board mounting structure. Effectively the new mounting configuration emulates the electrical characteristics of the thick metal backing plate printed circuit board diode mounting configuration previously described; and gives the RF switch designer an alternative choice of mounting.

Accordingly, an object of the present invention is to provide a new mounting structure for a packaged surface mount PIN diode.

A further object of the invention is to improve on/off port isolation of a surface mount shunt semiconductor RF switch packaged on a stand-alone printed circuit board.

A still further object of the invention is to provide a new mounting structure for a packaged PIN diode using a stand-alone printed circuit board in a combination that electrically emulates the prior plate mounted printed circuit board package for that diode.

And an additional object of the invention is to reduce the cost of manufacturing shunt RF switches while maintaining existing performance capability.

SUMMARY OF THE INVENTION

In accordance with the foregoing objects and advantages, the invention comprises a combination of a stand-alone circuit board, a packaged surface mount impedance element; and a an elongated conducting element. The flat end surface of a impedance element end terminal is attached to a metal trace on the circuit board, positioning the impedance element in an upstanding position, overlying the metal trace and leaving its other end terminal in an elevated position over the circuit board. The conducting element is of principally a U-shape, a shape that wraps around the impedance element. The conducting element, or ribbon is oriented in inverted position with a central position of said base attached to the second metal end and the two stems of the U-figure extending along opposed sides of the impedance element to complete an electrical connection on the circuit board, thereby mounting the impedance element to the circuit board.

In one embodiment of the invention the foregoing stems of the U-shaped ribbon extend through passages in the circuit board and are connected to the plated-on thin metal layer on the circuit board. In a second embodiment, electrical vias, connected to the plated-on thin metal layer on the board's underside, extend through the board to the upper surface and connect to respective plated-on solder pads adjacent opposite sides of the diode impedance element. The ribbon's stem ends are connected to respective ones of those solder pads, completing the electric circuit. In both embodiments the ends of the stems are flared outwardly in a direction away from the metal trace, and the supported diode, to provide a soldering surface on the ribbon that essentially lies parallel to the surface of the circuit board.

Until the present invention, it had not been known to apply tenting to switching diodes or other semiconductor switches as part of a stand-alone printed circuit board package. The invention successfully emulates the prior tented diode and metal backed printed circuit board designs in electrical performance. Electronic quality is maintained. The invention offers designers the opportunity to use stand-alone printed circuit boards for surface mounted diode shunt RF switches, a decided advantage, freed at last of the necessity to use the thick metal backing plate type printed circuit boards.

By eliminating the need for such a thick metal mounting plate, simpler, less expensive circuit board designs are possible; and overall circuit board weight drops, a significant advantage in aircraft and spacecraft electronic systems. And the board-to-plate bonding processes are no longer needed, reducing production lead times and, importantly, lowering manufacturing cost.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENTS

Figure 1:
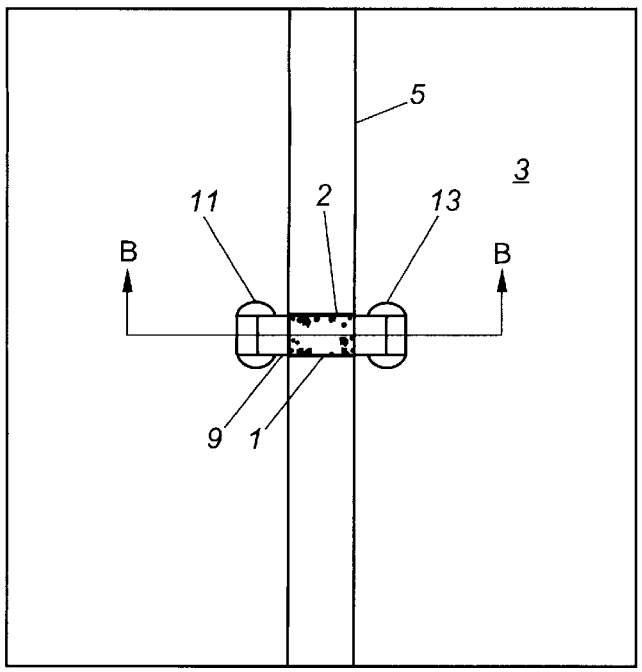
FIG. 1 illustrates an embodiment of the invention in top view.
Figure 2:
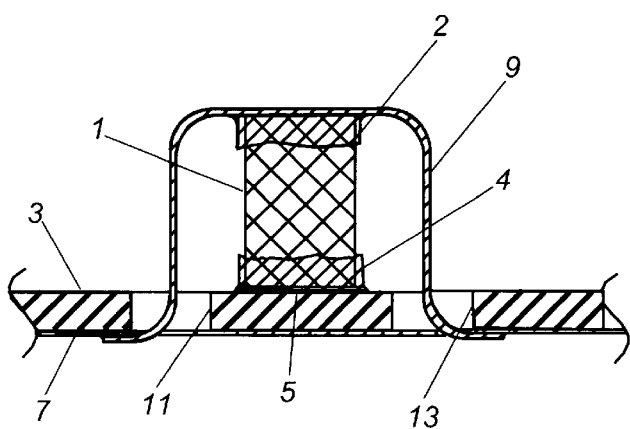
FIG. 2 is a section view of the embodiment of FIG. 1 taken along the lines B—B.

Reference is made to FIGS. 1 and 2, respectively illustrating the combination in top view, and in side section view, taken along the lines B—B in FIG. 1, which may be considered concurrently. As illustrated, a packaged PIN diode 1 is mounted on end in upright position on printed circuit board 3. The reader is reminded that when reference is made herein to a diode, without mention of a package, it is understood that the reference is to a diode that is in fact packaged, and not to the die form of a diode.

The circuit board is recognized as being of the stand-alone type, containing plated on conductors on the upper surface and a ground plane a plated-on thin metal layer. More specifically, board 3 contains a microstrip trace 5, a thin flat metal strip formed on the upper surface of the electrically insulative circuit board material or base. It also contains a thin metal layer or pad 7, visible in FIG. 2, typically one mil in thickness, formed on the underside surface of the circuit board, which is the conventional ground plane layer or pad. Typically both the traces on the upper surface and the ground plane layer are formed simultaneously by conventional circuit board plating technique during the circuit board's manufacture.

As those skilled in the art recognize, the circuit board 3 illustrated is actually a rectangular region or portion of a larger circuit board, one that supports other electronic elements and circuits defining an electronic device which incorporates the PIN diode, such as the RF switch, hereafter discussed, since the PIN diode assembly is rarely marketed separately, if at all. The illustrated portion of the circuit board is believed sufficient to separately illustrate the construction of the basic form of the invention, it being understood that the invention will be integrated with other electronic components in a single package.

Figure 3:
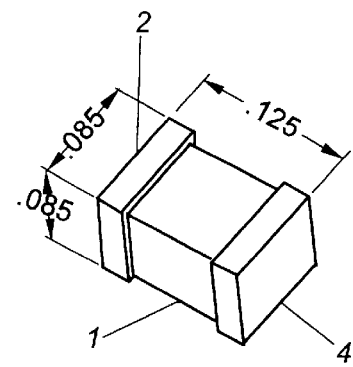
FIG. 3 is a perspective of the diode used in the embodiment of FIGS. 1 and 2.

Reference is briefly made to FIG. 3 illustrating a packaged PIN diode 1 in perspective. In appearance, the packaged PIN diode is generally rectanguloid in shape. Metal contact terminals 2 and 4 are located at each end, each representing the complementary ones of the anode and cathode ends of the diode. Those contact terminals are square in geometry, are of a small thickness, appearing wafer-like in appearance, and contain flat end faces. As used herein, the term square means a rectangle having four sides of equal length. A typical practical diode is about 0.085 inches by 0.085 inches at the square contact ends and is of an overall length of 0.125 inches, along its central axis, which is considered very minute in size.

Returning to FIG. 2, as illustrated in the section view and as mounted, one end contact terminal 2 of the diode, either an anode or cathode in polarity, is upstanding elevated from the surface of the circuit board. As shown in FIG. 1, the path of microstrip trace 5 at least extends under diode 1. That trace may continue to other locations as appropriate for the circuit in which the assembly is incorporated. The diode's other opposite polarity terminal 4, located at the other end, is in end face-to-face contact with the underlying microstrip trace 5. Suitably, terminal 4 is soldered to the trace by appropriate tin-lead solder, not illustrated, or bonded with conductive epoxy, to form a firm mechanical and electrical connection there between. Trace 5 is of a width necessary to provide the desired transmission line impedance characteristic, $z0$, selected by the designer. That width, desirably, is also, minimally, a major fraction of the width of the diode's end terminal 4.

A flat thin copper ribbon 9, appearing as an inverted generally U-shaped figure, extends over horizontally and is in flush contact with the elevated diode terminal 2, suitably soldered thereto or bonded with conductive epoxy. Metal ribbon 9 is preferably symmetrically positioned on the diode. It extends in a small loop from the top of the diode down to a position at the underside of printed circuit board 3, both to the left and to the right in the figure.

To the left, the ribbon loops down vertically, extends through a passage or slot 11 through the circuit board, and then loops around again or flares out by ninety degrees outwardly along the horizontal to the left in the figure, in a direction away from the diode, and is soldered or conductive epoxy bonded to the circuit board's ground plane or pad 7 on the underside, placing the metal ribbon loop and the ground pad in electrical contact. To the right, the ribbon 9 loops down vertically, extends through a slot 13 on the other side of metal trace 5, and then loops around again or flares, as variously termed, by ninety degrees outwardly along the horizontal to the right in the figure, in a direction away from the diode, and is soldered or epoxy pasted to the ground plane or ground pad 7. That places the other end of the metal ribbon and ground pad in electrical contact.

As alternatively characterized, the connection to terminal 2 is midway along the base of the U-shaped figure and the two stems, each containing outwardly oppositely directed flared tip ends, extend down alongside the diode for connection to symmetrically spaced locations on circuit board 3, essentially wrapping over the diode. Being wrapped over the diode, the ribbon essentially "tents" the diode. As illustrated in FIG. 1, metal ribbon 9 is as wide as diode 1. In other embodiments the width of ribbon 9 may be more narrow than the diode, more particularly, than the diodes end terminal, which should not significantly alter the operating results.

As described in the background to this specification, when PIN diode 1 is mounted with an end face of the terminal in contact with a microstrip line on the surface of the circuit board, that is, in upstanding position, the flat end face provides the largest possible contact area over which to evenly distribute current flow through the diode to the leads or traces on the printed circuit board. However, when the diode is mounted on its side to the circuit board that same current must flow through one of the smaller rectangular sides. That produces undesirable parasitics, which limits the minimum impedance possible from the diode. With the foregoing construction, PIN diodes may furnish minimal impedance in a shunt configuration. The described structure is found to provide the same favorable performance characteristics as and emulates the prior configuration.

Figure 4:
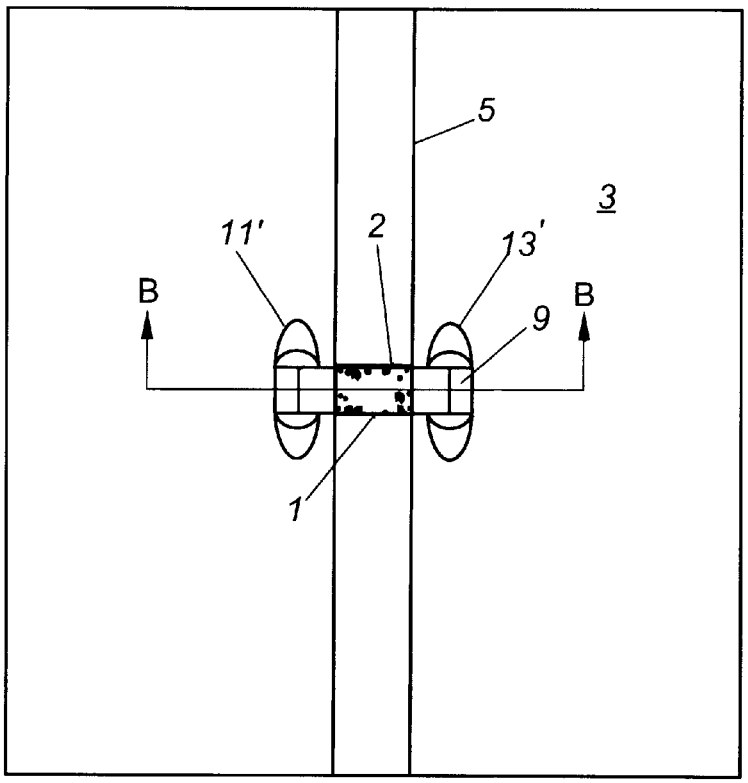
FIG. 4 illustrates another embodiment in top view, modified slightly from the embodiment of FIG. 1.
Figure 5:
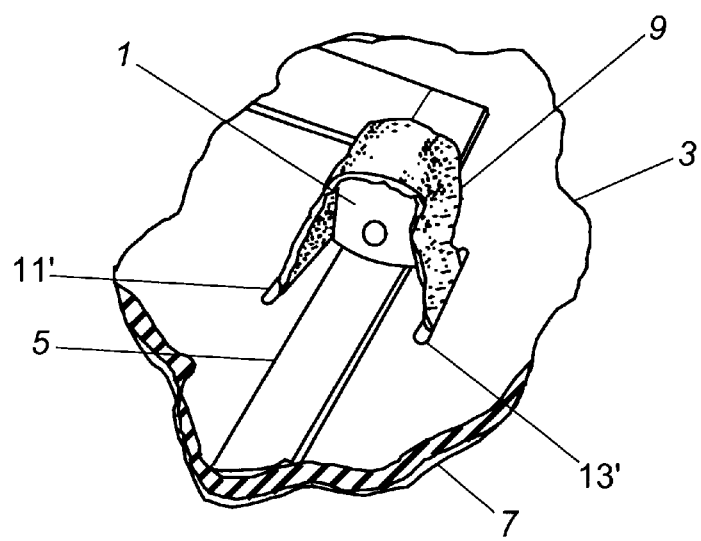
FIG. 5 is a partial perspective view of the diode mounting assembly as used in the embodiment of FIG. 4.

A modification of the foregoing construction is illustrated in top plan view in FIG. 4 and in a perspective view in FIG. 5. In this embodiment, the elements earlier described are given like numbers, except that those elements that are changed physically have the numbers primed. The embodiment contains all the same elements arranged in the same relationship as in FIGS. 1 and 2, and in side view, not illustrated, this embodiment is the same as that of FIG. 2. The difference is in the shape of the passages 11' and 13', corresponding to passages 11 and 13 in the preceding embodiment, located on either side of diode 1, through which the stems of the U-shaped ribbon 9 extend for connection with the metal layer 7 on the underside of the circuit board. Passages 11' and 13' are slots. Those slots extend in parallel in a direction parallel to metal trace 5, that underlies the PIN diode.

The foregoing slots allow the diode to be adjusted in position along the length of metal trace 5, prior to soldering the flared ends of the ribbon to ground plane 7. This feature is helpful in those applications in which the electrical distance to the end of the microstrip trace is important. Thus, as example, if the electrical length to the end of the circuit board must be one-quarter wavelength at the frequency of interest, to precisely position the diode at that position, the diode is moved while observing the reading of electrical measurement instrumentation. When the instrumentation, directly or indirectly, indicates that the correct distance has been achieved, further movement of the diode is halted, and the ends of the ribbon are soldered in place. This feature is useful in the RF switch in which the foregoing diode assembly is used, as later herein described.

Figure 6:
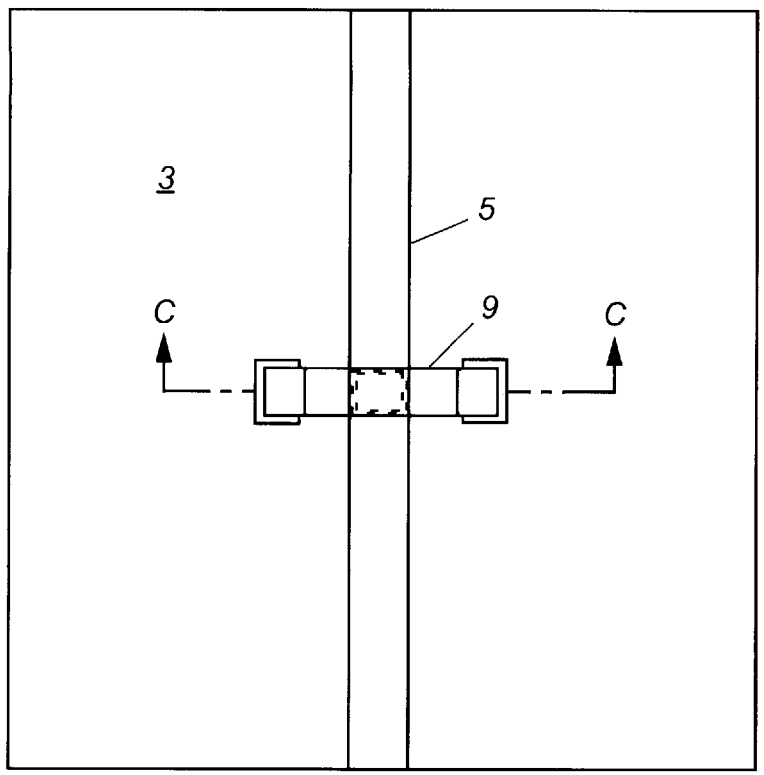
FIG. 6 illustrates still another embodiment in top view.
Figure 7:
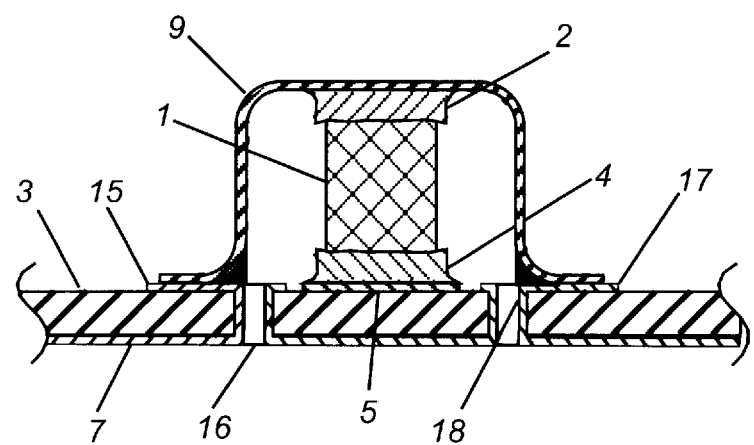
FIG. 7 is a section view of the embodiment of FIG. 6 taken along the lines C—C.

Reference is next made to an additional embodiment illustrated in FIGS. 6 and 7. FIG. 6 illustrates the embodiment in top view and FIG. 7 is a section view of FIG. 6 taken along lines C—C. For convenience, components that are included in this embodiment, which are the same as in the embodiment of FIGS. 1 and 2 are identified by the same numeral earlier used in connection with those figures. However, where the element is changed physically, that numeral is primed.

As in the preceding embodiments, diode 1 is mounted to the stand-alone printed circuit board 3' in upstanding position overlying a microstrip trace 5 formed on the upper surface of the circuit board; and, as viewed in FIG. 6, the path of that trace extends across that circuit board and underneath the diode. As viewed in FIG. 7, circuit board 3' contains a metal ground plane layer 7 formed on the underside as in the preceding embodiments. However, ground plane 7 is electrically connected to two solder pads 15 and 17 formed on the upper surface of the circuit board, which are symmetrically located on opposite sides of diode 1 and microstrip trace 5. The latter is accomplished by a pair of plated-through holes or vias 16 and 18 that extend through the thickness of circuit board between the upper and lower surfaces and are evenly symmetrically spaced on opposite sides of trace 5 and diode 1. At the upper surface the vias connect to an associated one of the two solder pads, 15 and 17, and at the under surface both vias electrically connect to the ground plane layer 7. If desired, additional vias can be incorporated to interconnect pads 15 and 17 with ground plane 7. As those skilled in the art appreciate, the traces, vias, ground plane and the connections therebetween are all plated-on conductors formed on the circuit board essentially simultaneously by conventional circuit board manufacturing technique.

Continuing with FIG. 7, as in the prior embodiments the flat thin copper ribbon 9', configured in an inverted letter U-shape geometry, extends over and, at a midway location along the horizontal or U-base member is in flush contact with the flat face of diode terminal 2, suitably soldered or conductively bonded thereto. The ribbon is symmetrically positioned on the diode and extends in a small loop from the top of the diode down to a position at the upper surface of printed circuit board 3', both to the left and to the right in the figure, forming the now familiar "tent" over the diode.

To the left, the ribbon loops down vertically, extends to the circuit board surface, and then loops around again by ninety degrees outwardly along the horizontal to the left in the figure or, as otherwise stated, flares outwardly away from the diode, and is soldered or conductively bonded to solder pad 15. To the right, the ribbon 9' loops down vertically, extends down to the circuit board surface, and then loops around again by ninety degrees outwardly along the horizontal to the right in the figure, or, as otherwise stated, flares outwardly away from the diode, and is soldered or epoxy pasted to solder pad 17 located on the opposite side of microstrip trace 5. In all other respects the embodiment is the same as described in the embodiment of FIGS. 1 and 2, which need not be here repeated, and attains the same operational performance.

The latter embodiment presents obvious production benefits useful in high volume production in which unit processing costs should be held to a minimum. The advantage is that the metal trace, ground plane and vias are all manufactured simultaneously in the printed circuit board manufacturing process. The tenting ribbon is not required to be manually threaded through the circuit board, as in the embodiment of FIG. 1. Instead, the preformed U-shaped ribbon is simply placed in position on the upper surface of the circuit board and soldered in place, a procedure readily accomplished by mechanized automatic circuit board stuffing and soldering equipment.

Figure 8:
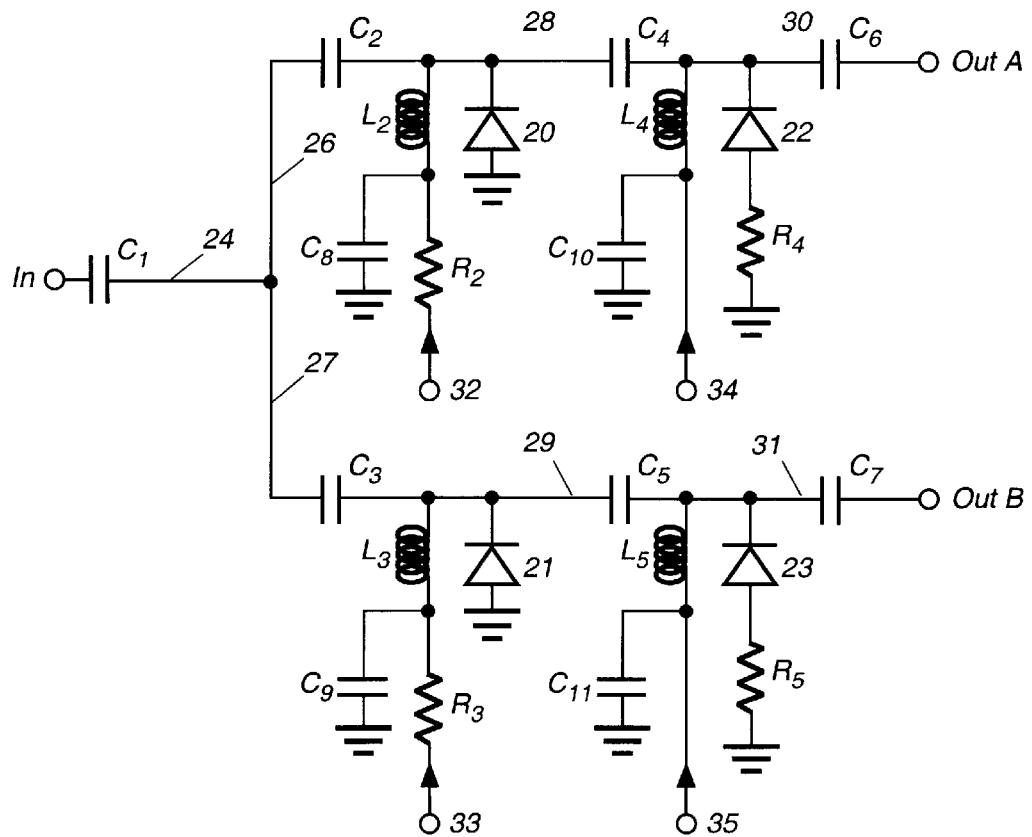
FIG. 8 is an electrical schematic of an RF switch that incorporates the present invention.

Any of the foregoing structures may be integrated with other elements to define a more complex electronic circuit upon a single circuit board as a unitary assembly or package to improve that electronic circuit. That is particularly apt for the electronic circuit, the RF switch, in which the PIN diode serves as an essential component element in an RF switch. The PIN diode assembly described replaces the prior assembly configurations and improves such RF switches. Reference is made to FIG. 8, which schematically illustrates a single pole multiple throw ("SPMTO") RF switch, more specifically a single pole double throw ("SPDT") RF switch. The configuration is that of a typical non-reflective shunt switch.

Figure 9:
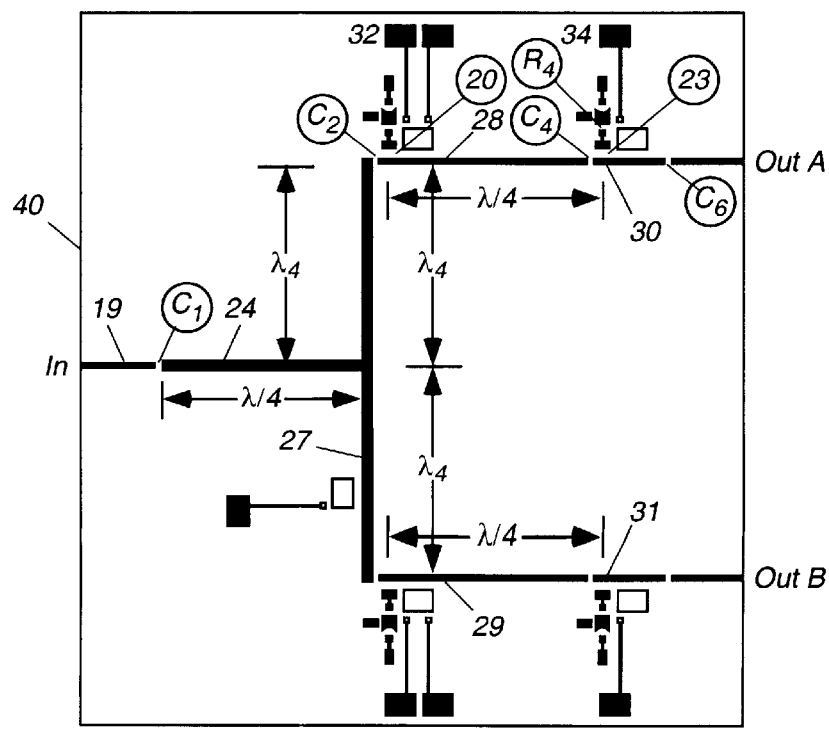
FIG. 9 is a top view of the circuit board layout for the RF switch schematically illustrated in FIG. 6.

It should be noted that the schematic diagram is the same, irrespective of whether the described new PIN diode assembly configuration or that of the prior configuration, containing the thick metal plate backed printed circuit board, is used. The schematic representation of the switch is independent of the circuit board employed or switching diode mounting configuration; and is used merely to describe the electrical elements and their operation. The accompanying FIG. 9 is a printed circuit board layout of the foregoing RF switch, discussed later herein.

With this RF switch, RF signals applied to the input port, IN, are alternately coupled through to one output port, OUT A, or to a second output port, OUT B. The circuit contains two diodes in each arm: Diode 20, which is a PIN diode, mounted as earlier described, and an output diode 22, which is also a PIN diode. Like diodes 21 and 23 are included in the other arm.

From the input the RF signal propagates through a DC blocking capacitor C1, which offers very low impedance at the RF frequencies concerned, along microstrip transmission line 24, whose characteristic impedance z0 is governed by the width of the metal trace or line, to the juncture of microstrip transmission lines 26 and 27, which are of equal length and of identical electrical characteristic. At that juncture the RF signal splits or branches to the alternate arms of the circuit. The electrical length of transmission line 24 and branches 26 and 27, as formed on the circuit board, are each one-quarter wavelength in length, for reasons hereinafter discussed.

Consider first the arm of the circuit shown at the top of the figure. The end of transmission line 26 is connected by a series DC blocking capacitor C2 to another length of transmission line 28. The other end of the latter line is connected by another series blocking capacitor C4 to another length of transmission line 30, and line 30 is connected by still another DC blocking capacitor C6 to OUT A.

PIN Diode 20 is biased with a DC voltage applied at control input 32. The control bias is coupled to transmission line 28 and to the cathode end of the diode through a low pass filter formed of a series resistance R2 and inductor L2, and a shunt capacitor C8 that is connected between the juncture of the last named elements and ground potential. L2, R2 and C8 are all discrete components. The diodes anode or positive terminal end is connected ground potential. The blocking capacitors C2 and C4 isolate the DC bias from the other portions of the circuit.

The cathode end of output diode 22 is connected to the microstrip line 30 between DC blocking capacitors C4 and C6, while its anode is connected through a resistor R4 to ground potential. Resistor R4 is of a value that equals the characteristic impedance, $Z_0$ of transmission line formed over the path through elements 28, 30 and OUT A.

Output diode 22 is biased with a DC voltage applied at control input 34. That control bias is supplied to the microstrip line and cathode end of the diode in series with an inductor L4. A capacitance C10 is connected between that control input and ground potential. The source biasing control input 34 is another DC voltage source that functions in unison with the aforementioned source for PIN diode 20, so that both diodes in the branch are either forward biased to conduct current or reverse biased to block current essentially simultaneously.

Assuming diodes 20 and 22 are back biased by the control voltages at control inputs 32 and 34, which turns the RF switch to the "on" condition at OUT A, the RF signal arriving over microstrip line 26 and through capacitor C2, propagates along microstrip line 28, through capacitor C4, microstrip line 30 and capacitor C6 to the output port OUT A. In this condition, the diodes cannot conduct RF current and provide an infinitely high impedance. Theoretically then all the RF signal should reach OUT A. In practice, however, the PIN diode 20 does conduct some current, as hereinafter described, which produces what is termed an insertion loss.

When the control voltage reverses in polarity to turn the RF switch to the "off" condition, both diodes are then forward biased. PIN diode 20 conducts RF signals and, theoretically, fully shunts RF signals from the microstrip line 28 to ground potential, bypassing the remainder of the circuit, including output OUT A. Ideally in conducting current, PIN diode 20 places one end of capacitance C4 at ground potential or slightly above ground potential, due to the small series resistance inherent in the PIN diode.

Concurrently, output diode 22, also now being in the current conducting state, effectively places resistance R4 across the output OUT A. Thus "looking" into terminal OUT A, the external electronic apparatus should "see" the characteristic impedance, Z0, of the microstrip line. That resistance serves as an absorbant load to any RF signal propagating in the wrong direction from that external electronic apparatus. The foregoing operation describes a single pole operation, and would constitute a single pole single throw RF switch, but for the inclusion of a second throw in the lower arm. By preventing propagation of the RF signal from the input IN to the output OUT A, the output is said to be isolated. Theoretically, that isolation should be total. In practice, as hereinafter discussed, the isolation is finite.

The second branch of the RF switch circuit represents a mirror image of the elements described in the first branch, and is another pole of the double throw switch. For convenience the elements in this branch are identified by the next larger number from that used for the corresponding elements in the first branch. Thus the corresponding inductor in the second branch to inductor L2 in the first branch is labeled L3; PIN diode 21 in the second branch corresponds to PIN diode 20 in the first; and so on. The elements in this second branch function in the same way to produce the same result. The only difference is that the control voltage sources in the second branch are 180 degrees out of phase with the corresponding sources in the first branch. Thus, when the diodes in the first branch are forward biased, those in the second branch are reverse biased; when one output is "on", the other is "off".

The foregoing description of operation is somewhat static and covers one throw of the RF switch. In a high speed switching application, for example, the control voltages at 32 and 34 are changed in polarity at high rates, periodically changing in polarity at rates of 10 MHz. or higher. The RF switch output changes accordingly at that rate, taking into account certain inherent delays and the diode's transition time.

Continuing with the specifics, when reversed biased, and therefore non-conducting, the PIN diode acts not only as an infinitely larger resistance but produces a capacitive effect as well. Prior investigators have described the equivalent electrical circuit of the diode in both its non-conducting and its conducting states. See "Pin Diode Operation and Design Trade-Offs, Sahjani & White, Applied Microwave, Spring 1991, pp 68–78. Because it introduces a capacitance effect, the diode provides a capacitive impedance path for RF to propagate to ground, shunting some of the RF power. The amount of such power loss is referred to as an insertion loss.

When forward biased, and thereby shunting the RF around output port OUT A, the diode should offer little or no resistance (or impedance) and therefore perfectly isolate that port. Unwanted impedance arises, for one, from parasitics, earlier described at some length. Viewing the schematic of FIG. 8, one sees that if a resistance or other impedance is placed in series with the diode, then a higher RF voltage drop occurs thereacross. That RF voltage drop is reflected through capacitor C4 and C6 to the output port OUT A.

The described tenting and mounting structure for the PIN diode, described in the preceeding embodiments of FIGS. 1–7, minimizes the parasitics for surface mount diodes and stand-alone circuit boards to essentially the same degree obtained with the tented diode and thick metal plate backed circuit boards. With the improved mounting configuration, an RF switching circuit having a reasonable isolation characteristic may now be incorporated upon a stand-alone type circuit board.

For optimum performance the RF switch should have low insertion loss and provide the highest possible isolation. However, early investigators have shown that the lower the insertion loss the lower is the isolation and, vice-versa, and that with a given PIN diode the two characteristics are a trade off and the isolation and insertion loss attained is a compromise. See the cited article by Sahjani & White.

In attempts to increase the isolation obtained in an RF switch, others have earlier suggested that two or more PIN diodes be operated in tandem. That is, two or more PIN diodes replace the single PIN diode in the circuit of FIG. 8. By operating those diodes in parallel, greater shunt current is achieved, better isolating the output. It is clear that implementation of such suggestion in a stand alone packaged surface mount architecture involves a generous number of components and offers more complexity and expense, which is undesirable. It may also not be practical due to the degradation in insertion loss brought about by use of multiple diodes. RF switches constructed in accordance with the present invention require fewer PIN diodes to achieve the same desired port isolation. With fewer PIN diodes there is a better possibility that insertion loss can also be maintained at satisfactory levels.

Reference is made to FIG. 9 which illustrates a layout of the RF switch circuit board in a top plan view. As those skilled in the art appreciate, the RF switch is an essentially planar shaped, being formed of printed conductors and small sized discrete electrical components. However the placement and sizing of those elements is important since the wavelength of the frequencies involved are quite small and though seemingly simple shapes have important inherent high frequency electrical characteristics. Some of those electronic characteristics are illustrated in schematic form in FIG. 8 using equivalent lumped circuit elements, later herein discussed.

The RF switch is formed on a stand-alone circuit board 40. Its input end IN to the left is a microstrip trace 19. The end of that trace is spaced from and confronts another trace 24 that connects to the middle of another microstrip trace oriented orthogonal thereto, lines 26 and 27, forming therewith a "T" shape. For convenience the location of certain of the electrical components that are mounted to the circuit board is indicated by encircling the designation for the component used in the schematic of FIG. 8 and including a lead line from the circle to the location. The spacing gap between traces 19 and 24 is bridged by DC blocking capacitor C1, placing the capacitor in series with those two transmission lines. The distance between the front end of trace 24 and the juncture with traces 26 and 27 is one-quarter wavelength at the relevant input frequency of wavelength. The length of traces 26 and 27 are each one quarter wavelength. The foregoing arrangement is found to make the circuit more broad-band in characteristic than otherwise. This aspect is described in the HP Application note 957-1, cited in the background to this description.

Additional microstrip traces 28 and 30 extend horizontally in the figure, to the right side of the circuit board. The trace at the right end forms output OUT A to the RF switch. Capacitor C2 is connected across the gap between lines 26 and 28; capacitor C4 is connected between trace 28 and 30; and capacitor C6 connects between trace 30 and OUT A. PIN diode 20 is connected between trace 28 and another trace at the location indicated; and output diode 22 is connected between trace 30 and another trace.

The distance between the location of PIN diode 20 and PIN diode 22 is also one-quarter wavelength at the relevant input frequency of the RF being inputted. When PIN diode 20 is conducting, the PIN diode effectively places the location to which it is connected at ground potential, theoretically, and in practice, at a very low impedance. According to classic transmission line theory, a short circuited quarter wavelength transmission line produces an infinitely high impedance at the input to that line. Thus in the operation of the RF switch, that high impedance input appears across PIN diode 22, blocking a path for RF current. That ensures that the impedance introduced across the output OUT A when output PIN diode 22 is conducting is its series resistance R4.

It is important to recognize that the foregoing distances expressed in wavelength are intended to be electrical lengths in contrast to physical lengths, although there is close correspondence between the two in microstrip transmission lines. Thus while the distance is calculated as a physical distance, that result is only a close approximation to the desired electrical length, which is not visible to the eye. The distances are small. As example, on a typical glass dielectric type circuit board at a frequency of one Gigahertz, a quarter wavelength is only about one and one-half inches. One way to ensure that the diodes are spaced properly for optimal performance is through the use of electrical instrumentation that measures the impedance at the location of the output diode. Then by moving the PIN diode along line 28, which corresponds to line 5 in FIG. 1, the impedance gradually increases and then decreases, peaking at one location. The location of the peak represents the quarter wavelength mark. And that is the location to place the diode in circuit. If both diodes are soldered in place, it is not possible to perform that adjustment step.

The advantage of the embodiment of FIG. 4 now becomes more apparent. Returning to FIG. 4, it is seen that the passages 11' and 13' through the circuit board for the ends or stems of the metal ribbon 9 tenting the diode are slots. The slots allow the diode to be moved back and forth along metal trace 5, so long as the ribbon ends are not soldered to the ground plane 7. Accordingly, in the fabrication of an initial prototype of an RF switch, all components are soldered in place, excepting the ends of the metal ribbon. The impedance measuring instrumentation is placed in operation across the output PIN diode 22; and PIN diode 20 is moved along the trace 28 to locate the impedance peak location as seen at the output PIN diode. Once that peak location is located, the ribbon ends are then soldered in place. It is anticipated that in production volumes, once the correct location for the PIN diode 20 is identified, that distance may then be physically measured. With that physical measurement in hand it will be unnecessary to continue with slots and the configuration for the mounting presented in FIGS. 1 and 2 or FIGS. 6 and 7 will be used.

At first glance one recognizes that the invention is described by its mechanical characteristics, visible to the naked eye and in hindsight appear simple in appearance. Those mechanical characteristics reside in an environment in which they have important impact on the high frequency electronic characteristics, not visible to the naked eye, but available only with the aid of electronic test instrumentation. And it is the best possible electronic characteristics that the inventors wish to achieve within the framework of reducing the manufacturing cost and/or weight of the component assembly. The described configuration achieves an acceptable level of electronic isolation achieved at the RF frequencies, and the minimization of parasitics sufficient to emulate the characteristics of the prior design, and, concurrently satisfies the goal of reducing cost and weight.

In the preceding description the shape of the metal tenting ribbon was described as generally U-shaped. It is appreciated that such terminology was selected for its general meaning, easily visualized, and is not intended to limit the shape to an absolutely perfect U letter of one particular font or another. It is understood that the stems of the U can be spread slightly, or bent slightly. As was illustrated in the perspective of FIG. 5, one stem of the U-figure is slightly bent out of true shape. And the ends of the stem are flared. All of the foregoing variations fall within the scope of the invention. The invention is not dependent on the preciseness of the letter U. Thus the term as used in this specification and the appended claims is intended to include any figure that wraps around the top and sides of PIN diode 20.

The RF switch improved by the foregoing invention is a non-reflective shunt switch. However, it is appreciated that the mounting configuration provides extended performance, that is no bar to incorporation of the mounting configuration in other RF switches or, for that matter, in any other electronic apparatus as well. Although the principal embodiment is with a PIN diode, it is appreciated that the invention may be used with other surface mount diodes as well, even though the apparatus does not require all the benefit associated with the invention and even though other acceptable mounting configurations are available for those other diodes and/or in those other electronic circuits.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. In combination:
   a packaged surface mount diode;
   said packaged surface mount diode containing a central body portion of rectanguloid shape and first and second electrical terminals;
   said first and second electrical terminals being located at respective first and second ends of said central body portion and being oriented coaxial therewith;
   each of said first and second electrical terminals comprising a thick rectangular geometry, including a flat end surface and flat side edges; said flat side edges of said first electrical terminal being aligned with the corresponding flat side edges of said second electrical terminal;
   said packaged surface mount diode being of a first predetermined length measured between said flat end surfaces of said first and second electrical terminals;
   a stand-alone printed circuit board, said printed circuit board including:
      a base of electrically insulative material, having upper and lower surfaces;
      at least one plated-on metal trace on said upper surface defining an electrical current conductive path; and
      a thin plated-on metal ground plane layer on said lower surface;
      a conductive metal band, said conductive metal band defining a generally U-shaped loop, said loop having a base portion and two stem portions;
      said base portion having a length greater than the length of any of said flat side edges of said electrical terminals;
      said stem portions being greater in length than said first predetermined length of said packaged surface mount diode;
      said stem portions each including an outwardly flared end edge;
      said packaged surface mount diode being supported on said printed circuit board oriented with a flat end surface of one of said first and second electrical terminals overlying and in electrical contact with said one conductive metal trace to complete an electrical path therebetween, wherein the other one of said first and second electrical terminals is positioned spaced from said upper surface of said printed circuit board;
      said base portion of said conductive metal band being symmetrically positioned overlying and in electrical contact with said other one of said first and second electrical terminals to complete an electrical path therebetween; and
      said stem portions of said conductive metal band positioned straddling said packaged surface mount diode and extending to said printed circuit board for making electrical contact with said ground plane layer to complete an electrical path therebetween.

2. The invention as defined in claim 1, wherein said printed circuit board further comprises:
   first and second passages extending through said printed circuit board, said passages being substantially identical and are symmetrically positioned on opposite sides of said conductive metal trace and said packaged surface mount diode; and wherein
   each of said stem portions of said conductive metal band extends through a respective one of said passages to said underside of said printed circuit board for making electrical contact with said ground plane layer.

3. The invention as defined in claim 2, wherein said passages each further comprise an elongate slot, said slot having a length greater than the width of said stem portion, whereby said packaged surface mount diode and said conductive metal band are positionable as a unit at selective positions along said slot.

4. The invention as defined in claim 1, wherein said printed circuit board further comprises:
   first and second solder pads on said upper surface, said solder pads being symmetrically positioned on opposite sides of said one metal trace and said packaged surface mount diode;
   first and second vias extending through said printed circuit board, said vias being connected to said ground plane layer and to respective ones of said first and second solder pads for completing current conductive paths between respective ones of said solder pads and said ground plane layer;
   said vias being symmetrically positioned on opposite sides of said one metal trace and said packaged surface mount diode; and
   said outwardly flared end of said stem portions being in electrical contact with a respective one of said first and second solder pads to complete a current conducting path therewith.

5. In combination:
   a stand-alone type circuit board, comprising a base of dielectric material, a metal trace on an upper surface thereof, and a thin metal layer covering a lower surface thereof;
   a surface mount diode, said surface mount diode including first and second metal ends, each of said metal ends having a flat end surface;
   said surface mount diode having said flat end surface of said first metal end attached to said metal trace to position said surface mount diode in an upstanding position, wherein said surface mount diode overlies said metal trace and wherein said second metal end of said surface mount diode lies in an elevated position over said stand-alone type circuit board;
   an elongated metal ribbon;
   said metal ribbon being wrapped over said diode and extending symmetrically along opposed sides of said surface mount diode to said circuit board.

6. The invention as defined in claim 5, wherein said stand-alone circuit board further comprises:
   first and second like-sized passages extending between said upper and lower surfaces of said stand-alone circuit board to provide access to said thin metal layer, said passages being located on opposite sides of said metal trace evenly spaced from said surface mount diode;

said ribbon extending through respective ones of said two passages and into electrical contact with said thin metal layer, whereby substantially identical parallel electrical paths are formed between said second metal end of said surface mount diode and said thin metal layer.

7. The invention as defined in claim 5, wherein said stand-alone circuit board further comprises:

first and second vias extending between said upper and lower surfaces of said stand-alone circuit board, said vias being connected at one end to said thin metal layer to provide first and second electrical paths between said thin metal layer and said upper surface of said stand-alone circuit board;

said vias being substantially identical and located on opposite sides of said metal trace evenly spaced from said surface mount diode;

means connecting an end of said metal ribbon electrically in common with one of said vias; and means connecting an opposed end of said metal ribbon electrically in common with the other one of said vias, whereby substantially identical parallel electrical paths are formed between said second metal end of said surface mount diode and said thin metal layer.

8. The invention as defined in claim 5, wherein said packaged surface mount diode comprises a PIN diode.

9. The invention as defined in claim 7, wherein said packaged surface mount diode comprises a PIN diode.

10. In combination:

a stand-alone type circuit board, comprising a base of dielectric material, a metal trace on an upper surface thereof, and a thin metal layer covering a lower surface thereof;

a surface mount diode, said surface mount diode including first and second metal ends, each of said metal ends having a flat end surface;

said surface mount diode having said flat end surface of said first metal end attached to said metal trace to position said surface mount diode in an upstanding position, wherein said surface mount diode overlies said metal trace and wherein said second metal end of said surface mount diode lies in an elevated position over said stand-alone type circuit board;

an elongate metal ribbon, said ribbon having a principal U-shape, said U-shape having a base and two spaced stems oriented perpendicular to said base;

said elongate metal ribbon being oriented with said U-shape in inverted position with a central position of said base being attached to said flat surface of said second metal end and said two stems extending along opposed sides of said surface mount diode to said circuit board.

11. The invention as defined in claim 10, wherein said stand-alone circuit board further comprises:

first and second like-sized passages extending between said upper and lower surfaces of said stand-alone circuit board to provide access to said thin metal layer, said passages being located on opposite sides of said metal trace evenly spaced from said surface mount diode;

said two stems extending through respective ones of said two passages and into electrical contact with said thin metal layer, whereby substantially identical parallel electrical paths are formed between said second metal end of said surface mount diode and said thin metal layer.

12. The invention as defined in claim 10, wherein said stand-alone circuit board further comprises:

first and second vias extending between said upper and lower surfaces of said stand-alone circuit board, said vias being connected at one end to said thin metal layer to provide first and second electrical paths between said thin metal layer and said upper surface of said stand-alone circuit board;

said vias being substantially identical and located on opposite sides of said metal trace evenly spaced from said surface mount diode;

means connecting an end of one stem electrically in common with one of said vias; and means connecting an end of the other stem electrically in common with the other one of said vias, whereby substantially identical parallel electrical paths are formed between said second metal end of said surface mount diode and said thin metal layer.

13. The invention as defined in claim 12, wherein each of said means comprises a solder pad located on said upper surface of said circuit board, said solder pads being equally spaced from said metal trace on opposed sides of said surface mount diode.

14. The invention as defined in claim 13, wherein each of said stems includes an outwardly flared end to provide a ribbon surface parallel to said upper surface of said circuit board, said flared ends flaring away from said surface mount diode;

each ribbon surface of said outwardly flared ends being soldered to a respective one of said solder pads.

15. The invention as defined in claim 10, wherein each of said stems includes an outwardly flared end to provide a ribbon surface parallel to said upper and lower surfaces of said circuit board, said flared ends flaring away from said surface mount diode.

16. The invention as defined in claim 10, wherein each of said stems includes an outwardly flared end to provide a ribbon surface parallel to said upper and lower surfaces of said circuit board, said flared ends flaring away from said surface mount diode;

said flared ends being positioned on the underside of said circuit board with said respective ribbon surface being affixed to said thin metal layer to make electrical contact therewith.

17. The invention as defined in claim 10, wherein said surface mount diode comprises a PIN diode.

18. The invention as defined in claim 16, wherein said surface mount diode comprises a PIN diode.

19. The invention as defined in claim 10, wherein said thin metal layer comprises a plated-on thin metal layer.

20. The invention as defined in claim 18, wherein said thin metal layer comprises a plated-on thin meta layer.

21. In an RF switch apparatus for connecting RF signals to an output when operated to an On condition and for inhibiting passage of RF signals from said output when operated to an Off condition, said RF switch apparatus including a shunting diode connected in shunt of said output for bypassing RF around said output when forward biased and permitting passage of RF to said output when reversed biased, control circuit means for selectively forward biasing and reverse biasing said shunting diode to respectively place said RF switch apparatus in the Off or On condition, respectively, and a printed circuit board for supporting said shunting diode and said control circuit means, the improvement wherein:

said printed circuit board comprises a stand-alone type circuit board, said stand-alone type circuit board comprising a base of dielectric material, a metal trace on an upper surface thereof associated with said shunting diode, and a thin metal layer covering a lower surface thereof;

said shunting diode comprises a packaged surface mount diode, said packaged surface mount diode including first and second metal ends, each of said metal ends having a flat end surface;

said packaged surface mount diode having said flat end surface of said first metal end attached to said metal trace to position said packaged surface mount diode in an upstanding position on said printed circuit board overlying said metal trace, whereby said second metal end of said packaged surface mount diode lies in an elevated position over said printed circuit board; and, further comprising:

an elongate metal ribbon, said ribbon comprising a U-shape, said U-shape including a base and two spaced stems oriented perpendicular to said base;

said elongate metal ribbon being oriented with said U-shape in inverted position relative to said printed circuit board with a central position of said base being attached to said flat surface of said second metal end of said packaged surface mount diode and said two stems extending along opposed sides of said packaged surface mount diode to said circuit board.

22. The invention as defined in claim 21, wherein said stand-alone circuit board further comprises:

first and second passages extending between said upper and lower surfaces of said stand-alone circuit board to provide access to said thin metal layer, said passages being located on opposite sides of said metal trace evenly spaced from said surface mount diode and being of like size;

said two stems extending through respective ones of said two passages and into electrical contact with said thin metal layer, whereby substantially identical parallel electrical paths are formed between said second metal end of said surface mount diode and said thin metal layer.

23. The invention as defined in claim 21, wherein said stand-alone circuit board further comprises:

first and second vias extending between said upper and lower surfaces of said stand-alone circuit board, said vias being connected at one end to said thin metal layer to provide first and second electrical paths between said thin metal layer and said upper surface of said stand-alone circuit board;

said vias being substantially identical and located on opposite sides of said metal trace evenly spaced from said packaged surface mount diode;

means connecting an end of one stem electrically in common with one of said vias; and means connecting an end of the other stem electrically in common with the other one of said vias, whereby substantially identical parallel electrical paths are formed between said second metal end of said surface mount diode and said thin metal layer.

24. The invention as defined in claim 21, wherein said packaged surface mount diode further comprises a PIN diode.

25. The invention as defined in claim 23, wherein said thin metal layer comprises a plated-on thin metal layer.

26. In combination:

a stand-alone type circuit board, comprising a base of dielectric material, a metal trace on an upper surface thereof and a metal layer covering a lower surface thereof;

a surface mount impedance element including first and second metal end surfaces;

said first end surface attached to said metal trace to position said impedance element in an upstanding position overlying said metal trace and wherein said second end surface lies in an elevated position over said stand-alone type circuit board;

an elongated conducting element wrapped over said impedance element and extending along its opposed sides to said circuit board.

27. The invention as defined in claim 26, wherein said stand-alone circuit board further comprises:

first and second like-sized passages extending between said upper and lower surfaces of said stand-alone circuit board to provide access to said metal layer, said passages being located on opposite sides of said metal trace evenly spaced from said surface mount impedance element;

said elongated conducting element extending through respective ones of said two passages and into electrical contact with said metal layer, whereby substantially identical parallel electrical paths are formed between said second metal end surface of said surface mount impedance element and said metal layer.

28. The invention as defined in claim 26, wherein said stand-alone circuit board further comprises:

first and second vias extending between said upper and lower surfaces of said stand-alone circuit board, said vias being connected at one end to said metal layer to provide first and second electrical paths between said metal layer and said upper surface of said stand-alone circuit board;

said vias being substantially identical and located on opposite sides of said metal trace evenly spaced from said surface mount impedance element;

means connecting an end of said elongated conducting element electrically in common with one of said vias; and means connecting an opposed end of said elongated conducting element electrically in common with the other one of said vias, whereby substantially identical parallel electrical paths are formed between said second metal end surface and said metal layer.

29. The invention as defined in claim 26, wherein said surface mount impedance element comprises a PIN diode.

30. The invention as defined in claim 26, wherein said surface mount impedance element comprises a capacitor.

* * * * *